United States Patent
Sun (10) Patent No.: US 7,666,767 B2
(45) Date of Patent: Feb. 23, 2010

(54) MASK FOR SEQUENTIAL LATERAL SOLIDIFICATION (SLS) PROCESS AND A METHOD THEREOF

(75) Inventor: Ming-Wei Sun, Jhubei (TW)

(73) Assignee: AU Optronics Corp., Hsinchu (TW)

( * ) Notice: Subject to any disclaimer, the term of this patent is extended or adjusted under 35 U.S.C. 154(b) by 507 days.

(21) Appl. No.: 11/495,517

(22) Filed: Jul. 31, 2006

(65) Prior Publication Data
US 2007/0048978 A1    Mar. 1, 2007

(30) Foreign Application Priority Data
Aug. 23, 2005    (TW) .................. 94128805 A (51) Int. Cl.
H01L 21/324    (2006.01)
G03F 1/00    (2006.01)
C30B 1/06    (2006.01)
C30B 28/02    (2006.01)

(52) U.S. Cl. ............... 438/487; 438/166; 257/E21.134; 430/5; 117/8; 117/10

(58) Field of Classification Search ............... 438/166, 438/486, 487; 430/5; 257/E21.133, E21.134; 117/8, 10
See application file for complete search history.

(56) References Cited

U.S. PATENT DOCUMENTS

| | | | | |
|---|---|---|---|---|
| 6,300,175 B1 * | 10/2001 | Moon | ............... | 438/158 |
| 6,326,286 B1 * | 12/2001 | Park et al. | ............... | 438/478 |
| 6,368,945 B1 * | 4/2002 | Im | ............... | 438/487 |
| 6,495,405 B2 * | 12/2002 | Voutsas et al. | ............... | 438/166 |
| 6,555,449 B1 * | 4/2003 | Im et al. | ............... | 438/487 |
| 6,764,886 B2 * | 7/2004 | Yamazaki et al. | ............... | 438/164 |
| 6,770,545 B2 * | 8/2004 | Yang | ............... | 438/487 |
| 6,867,151 B2 * | 3/2005 | Jung | ............... | 438/778 |
| 6,959,029 B2 * | 10/2005 | Voutsas et al. | ............... | 372/103 |
| 6,962,860 B2 * | 11/2005 | Yamazaki et al. | ............... | 438/487 |
| 6,979,605 B2 * | 12/2005 | Yamazaki et al. | ............... | 438/166 |
| 6,984,573 B2 * | 1/2006 | Yamazaki et al. | ............... | 438/487 |
| 7,015,123 B2 * | 3/2006 | Yang | ............... | 438/486 |
| 7,029,996 B2 * | 4/2006 | Im et al. | ............... | 438/487 |
| 7,132,204 B2 * | 11/2006 | Jung | ............... | 430/5 |
| 7,193,240 B2 * | 3/2007 | Jung | ............... | 257/75 |
| 7,238,559 B2 * | 7/2007 | Cho | ............... | 438/166 |
| 7,276,317 B2 * | 10/2007 | You | ............... | 430/5 |
| 7,294,538 B2 * | 11/2007 | Kim et al. | ............... | 438/166 |
| 7,294,857 B2 * | 11/2007 | Kim et al. | ............... | 257/72 |
| 7,316,871 B2 * | 1/2008 | You | ............... | 430/5 |
| 7,319,056 B2 * | 1/2008 | Im et al. | ............... | 438/166 |
| 7,329,936 B2 * | 2/2008 | Jung | ............... | 257/435 |
| 7,354,810 B2 * | 4/2008 | Takaoka et al. | ............... | 438/166 |

(Continued)

FOREIGN PATENT DOCUMENTS

CN    1811592    *    8/2006

(Continued)

Primary Examiner—M. Wilczewski
(74) Attorney, Agent, or Firm—Birch, Stewart, Kolasch & Birch, LLP (57) ABSTRACT

A mask for sequential lateral solidification (SLS) process with at least one transparency region is provided. The transparent region is defined by two lengthwise edges, a front edge, and a rear edge. The two lengthwise edges also define a quadrilateral. The front edge is located outside the quadrilateral, and the rear edge is located inside the quadrilateral.

8 Claims, 7 Drawing Sheets

U.S. PATENT DOCUMENTS

| | | | |
|---|---|---|---|
| 7,368,204 B2 * | 5/2008 | You | 430/5 |
| 7,399,685 B2 * | 7/2008 | Jung | 438/478 |
| 7,476,475 B2 * | 1/2009 | Park | 430/5 |
| 7,510,920 B2 * | 3/2009 | Yamazaki et al. | 438/166 |
| 2001/0041426 A1 * | 11/2001 | Im | 438/479 |
| 2002/0179004 A1 * | 12/2002 | Jung | 117/43 |
| 2002/0197759 A1 * | 12/2002 | Yang | 438/48 |
| 2003/0096489 A1 * | 5/2003 | Im et al. | 438/487 |
| 2003/0119286 A1 * | 6/2003 | Im et al. | 438/487 |
| 2004/0127066 A1 * | 7/2004 | Jung | 438/778 |
| 2004/0180274 A1 * | 9/2004 | Jung | 430/5 |
| 2004/0224487 A1 * | 11/2004 | Yang | 438/487 |
| 2004/0253840 A1 * | 12/2004 | You | 438/799 |
| 2004/0259296 A1 * | 12/2004 | Voutsas et al. | 438/166 |
| 2005/0124145 A1 * | 6/2005 | Jung | 438/487 |
| 2005/0139788 A1 * | 6/2005 | You | 250/492.22 |
| 2005/0139925 A1 * | 6/2005 | You | 257/351 |
| 2005/0142450 A1 * | 6/2005 | Jung | 430/5 |
| 2005/0142451 A1 * | 6/2005 | You | 430/5 |
| 2005/0142452 A1 * | 6/2005 | You | 430/5 |
| 2005/0142453 A1 * | 6/2005 | Seo et al. | 430/5 |
| 2005/0221569 A1 * | 10/2005 | Nakata | 438/308 |
| 2005/0255640 A1 * | 11/2005 | Im et al. | 438/166 |
| 2005/0271952 A1 * | 12/2005 | Jung | 430/5 |
| 2006/0148165 A1 * | 7/2006 | Chung et al. | 438/222 |
| 2006/0276013 A1 * | 12/2006 | Chao | 438/487 |
| 2007/0012664 A1 * | 1/2007 | Im | 219/121.65 |
| 2007/0020536 A1 * | 1/2007 | Jung | 430/5 |
| 2007/0020942 A1 * | 1/2007 | Im | 438/719 |
| 2007/0032050 A1 * | 2/2007 | Chung et al. | 438/487 |
| 2007/0048978 A1 * | 3/2007 | Sun | 438/486 |
| 2007/0141478 A1 * | 6/2007 | Chen et al. | 430/5 |
| 2007/0148924 A1 * | 6/2007 | Park | 438/486 |
| 2007/0184638 A1 * | 8/2007 | Kang et al. | 438/487 |
| 2007/0196743 A1 * | 8/2007 | Chu et al. | 430/5 |
| 2007/0202668 A1 * | 8/2007 | Im et al. | 438/487 |
| 2007/0264806 A1 * | 11/2007 | Park | 438/486 |
| 2008/0045042 A1 * | 2/2008 | Chu et al. | 438/799 |
| 2008/0123200 A1 * | 5/2008 | Chu et al. | 359/738 |
| 2008/0141935 A1 * | 6/2008 | Jung | 118/620 |
| 2009/0098471 A1 * | 4/2009 | Chu et al. | 430/5 |

FOREIGN PATENT DOCUMENTS

| | | | |
|---|---|---|---|
| KR | 10-2004-0051980 A | | 6/2004 |
| KR | 2006016421 | * | 2/2006 |
| WO | WO 2005/029546 | * | 3/2005 |

* cited by examiner

MASK FOR SEQUENTIAL LATERAL SOLIDIFICATION (SLS) PROCESS AND A METHOD THEREOF

BACKGROUND OF THE INVENTION (1) Field of the Invention

This invention relates to a mask, and more particularly relates to a mask applied in sequential lateral solidification (SLS) processes.

(2) Description of the Prior Art

A liquid crystal display (LCD) with the advantages of slim size, low power consumption and radiation damage, has become a preferred choice among various displaying products such as CRT displays. For the same reason, the LCD has been widely used in various electronic devices such as desk top computers, personal digital assistants, note books, digital cameras, cell phones, and etc.

Figure 1:
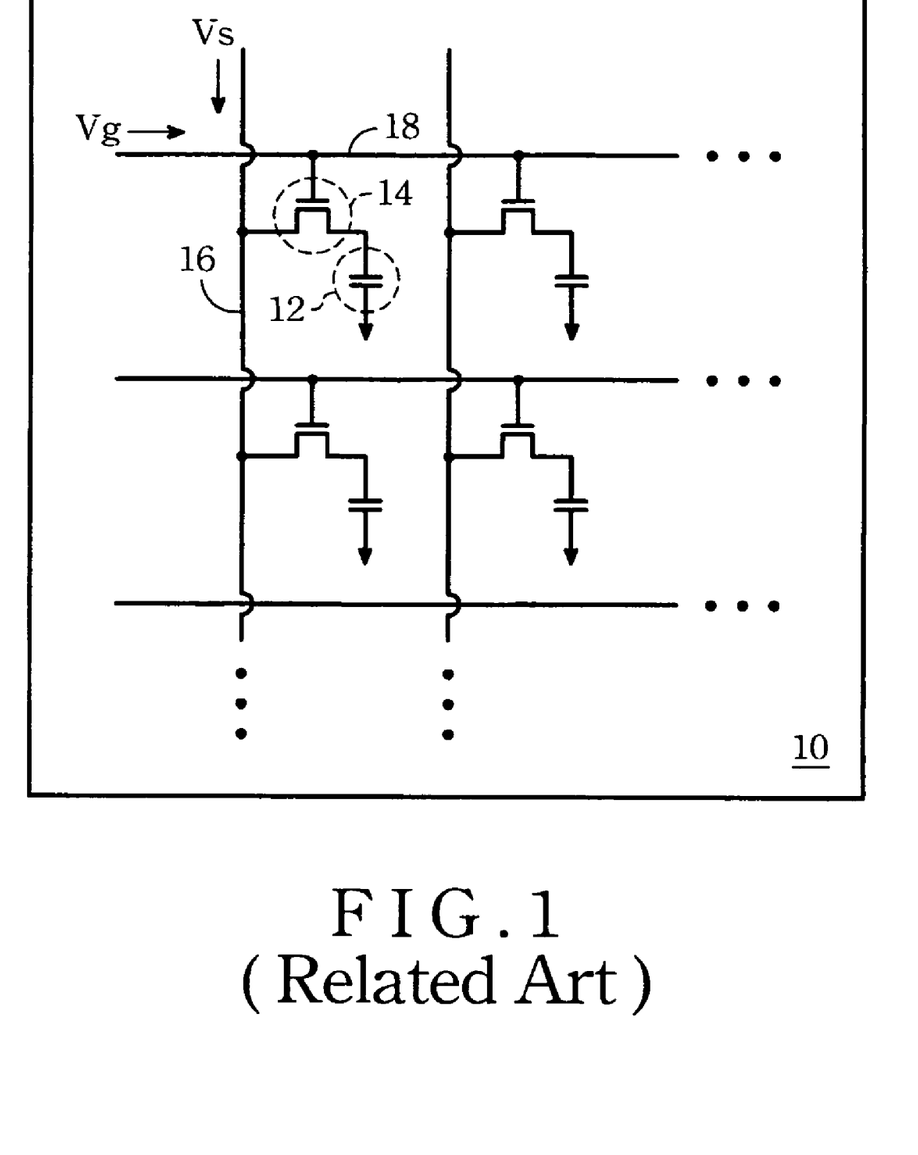
FIG. 1 is a schematic view of a typical active matrix liquid crystal display (AMLCD) panel.

FIG. 1 shows a typical active matrix liquid crystal display (AMLCD) panel 10 with a plurality of pixel devices 12 arrayed in matrix. Each pixel device 12 has a connection with a thin film transistor (TFT) 14 operated as a switch for charging and discharging the pixel device 12. The source electrode of the TFT 14 is electrically connected with a source driver (not shown) through a signal line 16. The gate electrode of the TFT 14 is electrically connected to a scan driver (not shown) through a gate line 18. Displaying signals are transformed into source driving voltage (Vs) and gate driving voltage (Vg) applied to the source electrode and gate electrode of the TFT respectively for generating images.

Due to the temperature limitation of the glass substrate, in traditional manner, the TFTs 14 formed on the LCD panel 10 must be amorphous silicon TFTs. However, the switching speed, the electric characters, and the reliability of the amorphous silicon TFTs are not qualified as being used in the drivers of the LCD panel 10 for controlling the display. Instead, polysilicon TFTs are suggested to be used in the drivers to achieve a higher operation speed. In order to meet the dilemma, additional silicon chips for allocating the drivers must be used to connect to the LCD panel 10 through some pipelines.

There are two reasons that the polysilicon TFTs fabricated on the glass substrate are demanded in present. First, the pixel devices need a higher switching speed for larger LCD panels. Second, the drivers must be formed on the glass substrate for a slimmer LCD panel. Therefore, the need of forming high quality polysilicon layers on the glass substrate has become urgent.

Figure 2:
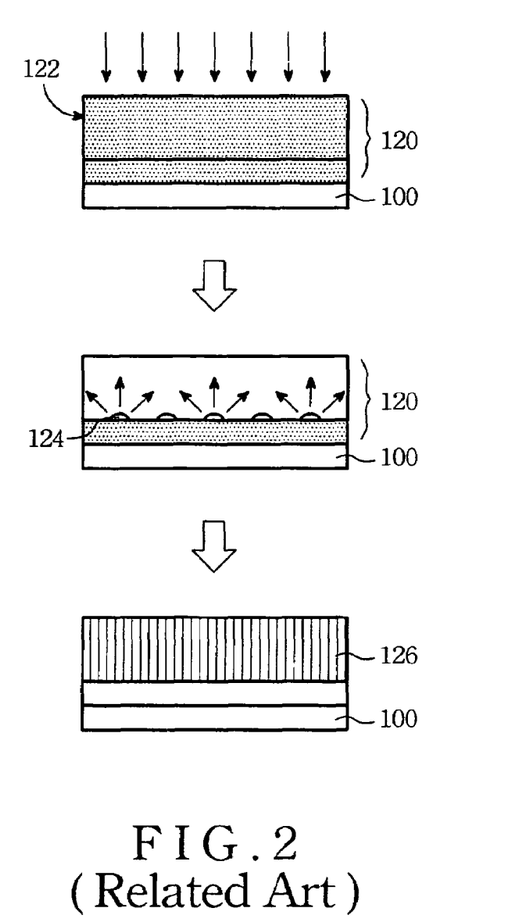
FIG. 2 depicts a typical low temperature polysilicon (LTPS) fabrication process.

FIG. 2 shows a traditional low temperature polysilicon (LTPS) fabrication process. First, an amorphous silicon layer 120 is formed atop a substrate 100. Then, laser illumination is applied on the amorphous silicon layer 120 to form a melted layer 122 near the top surface of the amorphous silicon layer 120. The amorphous silicon material right under the melted layer 122 is utilized as seeds 124 growing upward to create grains 126. Due to the limitation of the thickness of the melted layer 122, the grain size is less than 1 micron and the promotion of the electric ability for the resultant TFTs is limited.

Figure 3:
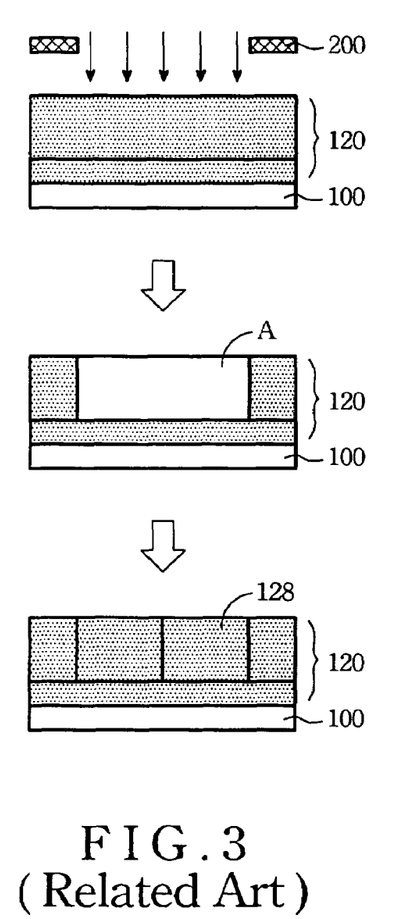
FIG. 3 depicts a typical lateral solidification process.

In order to form larger grains, the lateral solidification process is developed as shown in FIG. 3. The lateral solidification process uses a mask 200 for melting a predetermined region A within the amorphous layer 120. A lateral temperature gradient is generated in the melted region A. Thus, the amorphous silicon material close to the edge of the melted region A is utilized as seeds growing toward the center of the melted region A to generate larger grains 128.

Figure 4A:
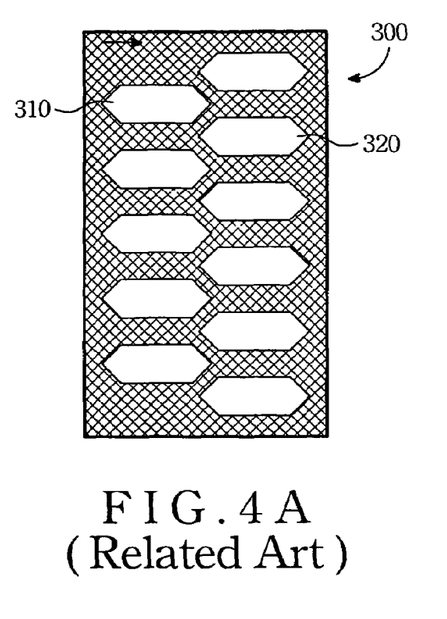
FIGS. 4A to 4C show typical masks utilized in sequential lateral solidification (SLS) processes.

FIG. 4A shows a typical mask 300 utilized in the sequential lateral solidification (SLS) process. As shown, the mask 300 has a plurality of first transparent regions 310 lined in rows, and a plurality of second transparent regions 320 lined in rows. Each first transparent region 310 is aligned to the shielded region between two neighboring second transparent regions 320.

Figure 4B:
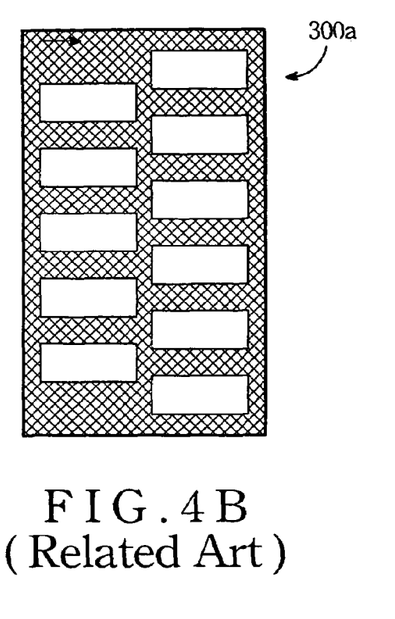
Figures 4C, 5:
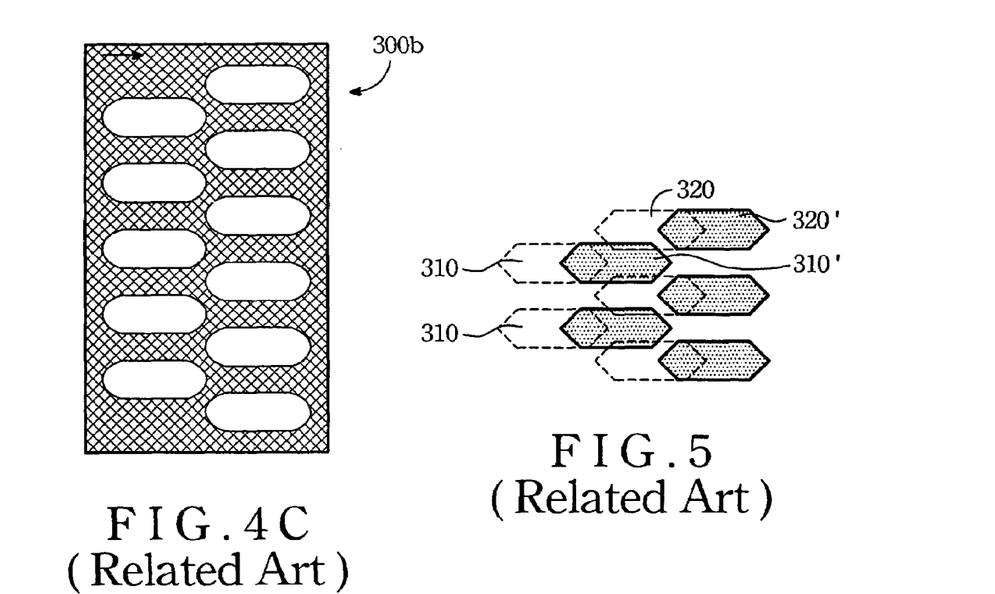
FIG. 5 depicts a typical SLS process using the mask of FIG. 4A.

FIGS. 4B and 4C show some variety of the typical masks applied in the SLS process. Other than the transparent regions 310, 320 of the mask 300 of FIG. 4A, which characterized with the symmetrical V-shaped front edge and V-shaped rear edge, these masks 300a, 300b have transparent regions thereon being defined by the front edge and the rear edge with symmetrical trapezoid-shaped or semicircle-shaped, respectively.

Figure 6A:
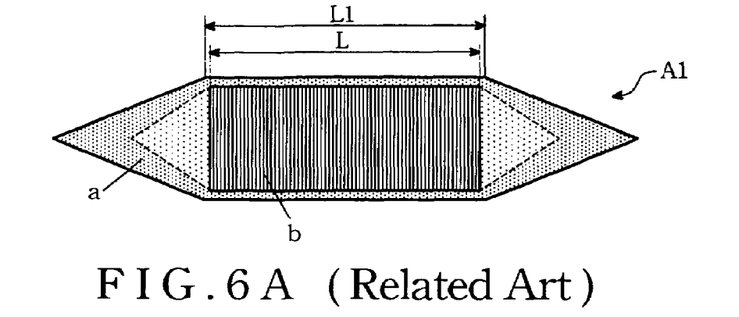
FIG. 6A is an enlarged view of the first crystallized region formed in the SLS process of FIG. 5.
Figure 6B:
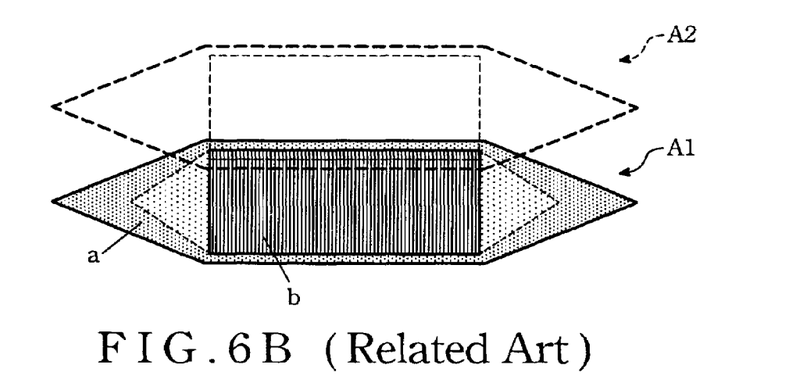
FIG. 6B is an enlarged view of the second crystallized region in relation with the first crystallized region formed in the SLS process of FIG. 5.

FIG. 5 depicts the SLS process using the mask 300 of FIG. 4A. In the first illumination step (as defined by the dash line), laser illumination melts the amorphous silicon layer through the first transparent regions 310 and the second transparent regions 320 of the mask 300 to form a plurality of first crystallized regions A1. FIG. 6A shows an enlarged view of the first crystallized region A1 formed in the amorphous layer in the present illumination step. Affected by optical interference and diffraction near the boundary of the transparent region 310, 320, a boundary portion a with grains of random orientation and size exists in the first crystallized region A1, and only the central portion b of the first crystallized region A1 has unified lateral grains. Therefore, it is understood that the length L of the central portion b can not be greater than the length L1 of the lengthwise edge of the first crystallized region A1.

Figure 6C:
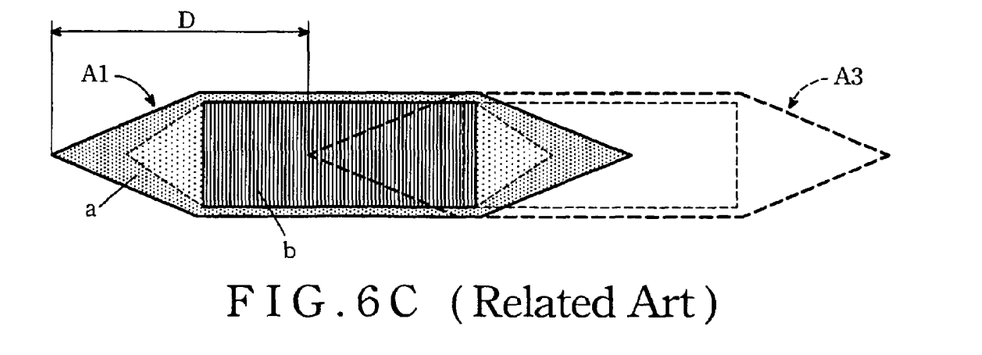
FIG. 6C is an enlarged view of the third crystallized region in relation with the first crystallized region formed in the SLS process of FIG. 5.

In the second laser illumination step defined by the solid line of FIG. 5, the mask 300 moves rightward to have the first transparent region 310 aligned to the amorphous layer between the first crystallized regions A1. It is noted that the width of the first transparent region 310 is greater than the interval between two neighboring second transparent regions 320. Thus, as shown in FIG. 6C, the second crystallized region A2 generated in the present illumination step partially overlaps the first crystallized regions A1. Thereby, the random portion a near the lengthwise edges of the first crystallized region A1 is re-crystallized to improve the uniformity of the grains therein.

As to the improvement of the random portion a near the front edge and the rear edge of the first crystallized region A1, a limitation of the movement of the mask between two sequential steps of the SLS process exists. In detail, as shown in FIG. 6C, the distance D between the first crystallized region A1 generated in the first laser illumination step and the third crystallized region A3 generated in the second illumination step must be smaller than the length L of the central portion b to make sure the overlap between the first crystallized region A1 and the third crystallized region A3 are sufficient to eliminate the random portion a near the front edge of the first crystallized region A1. The fabrication speed of the SLS process is limited thereby. Meanwhile, the increasing of the overlapping area also increases the probability of agglomeration to result holing in the amorphous layer.

Accordingly, a mask utilized in the SLS process is provided in the present invention not only for eliminating the random portions but also for increasing the fabrication speed.

SUMMARY OF THE INVENTION

A mask utilized in the SLS process for crystallizing an amorphous layer to form a polycrystalline layer is provided in the present invention. The mask has at least a transparent region, which is defined by two lengthwise edges, a front edge, and a rear edge. The two lengthwise edges also define a quadrilateral. The front edge is located outside the quadrilateral, and the rear edge is located inside the quadrilateral.

By using the mask provided in the present invention, a method of crystallizing an amorphous layer is also provided. The method comprises the steps of: (1) providing a substrate; (2) forming an amorphous layer on the substrate; (3) having the mask aligned to the substrate; (4) crystallizing the amorphous layer through the mask to form a plurality of first crystallized regions respecting to the transparent regions; (5) moving the mask to have a projection of the front edge or the rear edge of the transparent region on the amorphous layer overlapping the first crystallized regions; and (6) crystallizing the amorphous layer through the mask to form a plurality of second crystallized regions.

BRIEF DESCRIPTION OF THE DRAWINGS

The present invention will now be specified with reference to its preferred embodiment illustrated in the drawings, in which.

DESCRIPTION OF THE PREFERRED EMBODIMENTS

Figure 7A:
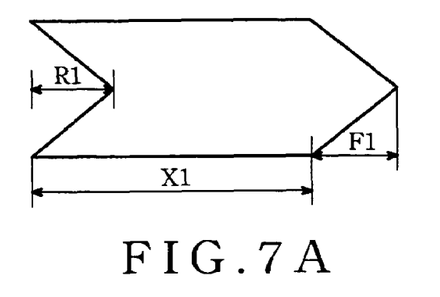
FIGS. 7A to 7I depict the first to the ninth preferred embodiments of the transparent region of the mask in accordance with the present invention.

FIG. 7A shows a first preferred embodiment of the transparent region on the mask in accordance with the present invention. As shown, the transparent region is defined by two lengthwise edges, a front edge, and a rear edge. The two respected lengthwise edges are parallel with each other and with the same length X1. The front edge is V-shaped and located outside a quadrilateral defined by the two lengthwise edges. A top of the V-shaped front edge is located on a central of the transparent region and leaving the quadrilateral (rightward in the figure) with a predetermined distance F1. The rear edge is V-shaped and located inside the quadrilateral. A top of the V-shaped rear edge is located on the central of the transparent region and entering the quadrilateral (rightward in the figure) with a predetermined distance R1.

The front edge and the rear edge in the present embodiment are of the same shape and dimension. That is, the distance F1 is identical to the distance R1. However, as shown in the second preferred embodiment of the transparent region of FIG. 7B, a predetermined distance F2, with which the top of the V-shaped front edge leaving the quadrilateral defined by the two lengthwise edges, is greater than a predetermined distance R2, with which the top of the V-shaped rear edge entering the quadrilateral. That is, the angle c defined by the both sides of the V-shaped front edge is smaller than the angle d defined by the both sides of the V-shaped rear edge. In addition, as a preferred embodiment, the angle c may be ranged between 10 to 90 degrees, and the angle d may be ranged between 90 and 170 degrees.

FIGS. 7A to 7F are the first to sixth preferred embodiments of transparent region on the mask in accordance with the present invention. The front edges of the transparent region described in these embodiments may be sorted as V-shaped referring to FIGS. 7A and 7B, circular-shaped referring to FIGS. 7C and 7D, or trapezoid-shaped referring to FIGS. 7E and 7F. The rear edge of the transparent regions may be also sorted as V-shaped referring to FIGS. 7A and 7B, circular-shaped referring to FIGS. 7C and 7D, or trapezoid-shaped referring to FIGS. 7E and 7F.

Figure 7B:
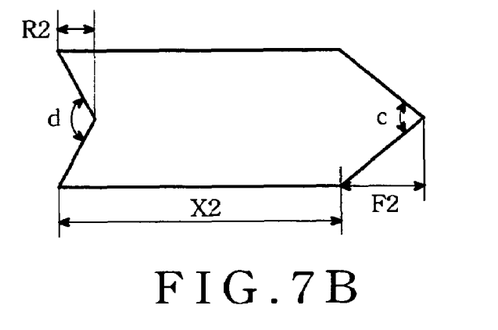
Figure 7C:
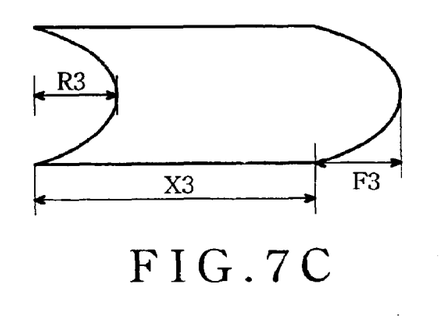
Figure 7D:
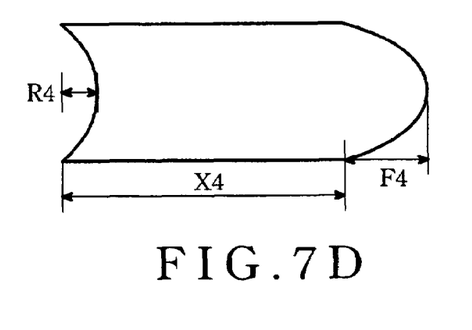

The transparent regions in the above mentioned embodiments are defined by the front edge and the rear edge of similar shapes. That is, as shown in FIGS. 7A and 7B, as the front edge of the transparent region is V-shaped, the rear edge of the transparent region is also V-shaped. As shown in FIGS. 7C and 7D, as the front edge is circular-shaped, the rear edge is also circular-shaped. In addition, as shown in FIGS. 7E and 7F, as the front edge is trapezoid-shaped, the rear edge is also trapezoid-shaped.

Figure 7E:
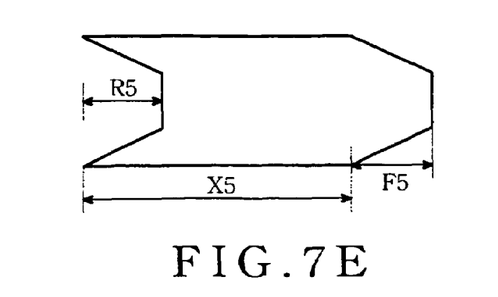
Figure 7F:
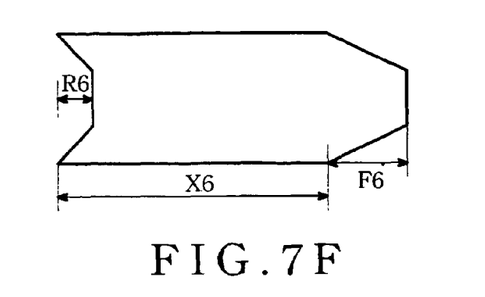
Figure 7G:
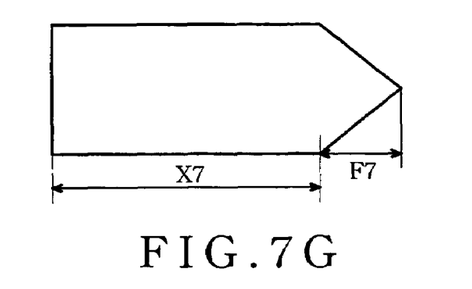
Figure 7H:
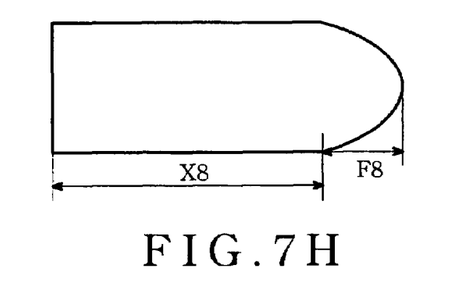
Figure 7I:
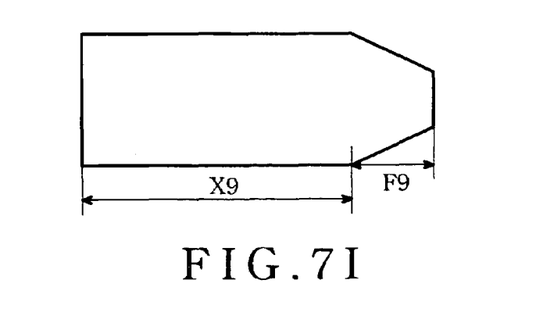

The distance with which the top of the front edge leaving the quadrilateral may be identical to the distance with which the top of the rear edge entering the quadrilateral, as shown in FIGS. 7A, 7C, and 7E, or not, as shown in FIGS. 7B, 7D, and 7F. However, it is preferred that the distance with which the top of the front edge leaving the quadrilateral being not less than the distance with which the top of the rear edge entering the quadrilateral. In addition, in the seventh to the ninth preferred embodiments of the present invention as shown in FIGS. 7G to 7I, even the front edge of the transparent region is V-shaped, circular-shaped, or trapezoid-shaped, respectively, the rear edge thereof is a straight line.

Figure 8A:
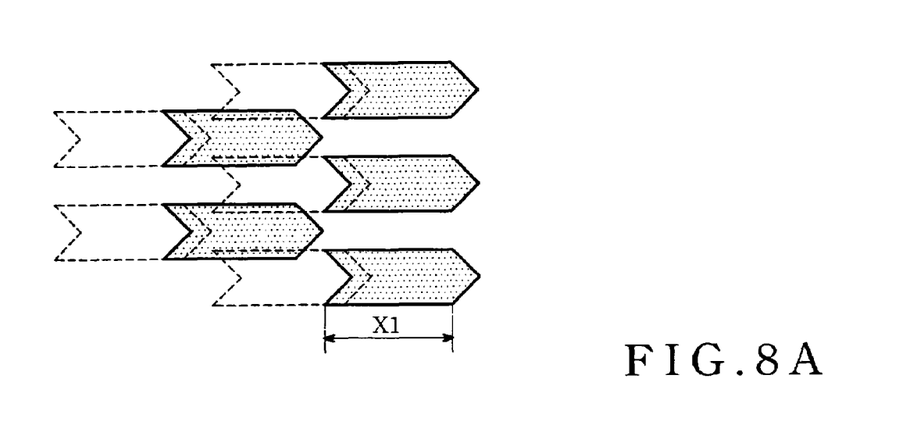
FIG. 8A depicts the movement of the masks of FIG. 7A during two sequential laser illumination steps of the SLS process in accordance with the present invention.
Figure 8B:
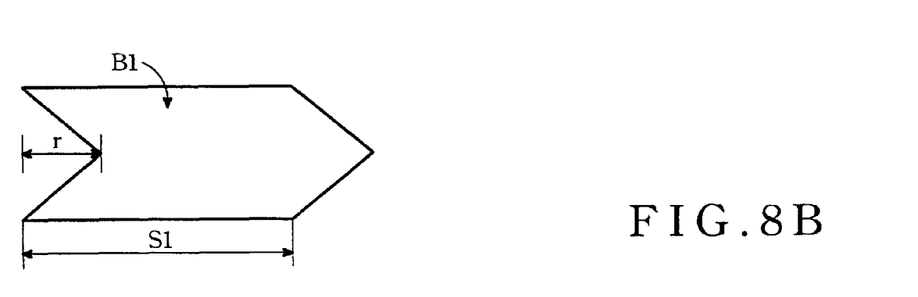
FIGS. 8B and 8C depict the first crystallized region and the second crystallized region formed in the SLS process respecting to the movement of the mask as shown in FIG. 8A.
Figure 8C:
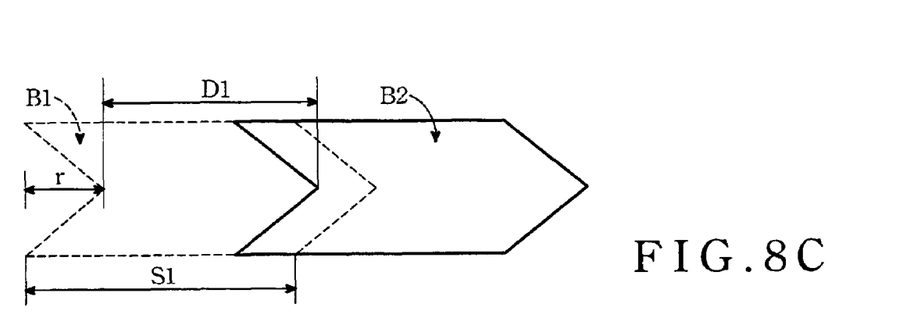

FIG. 8A depicts a sequential lateral solidification (SLS) process taking the mask of FIG. 7A as an example. Firstly, as referring to FIG. 2, a substrate is provided with an amorphous layer formed thereon. Then, as defined by the dash line in FIG. 8A, in the first laser illumination step, after aligning the mask to the substrate, the transparent regions on the mask are projected on the amorphous layer with a predetermined magnification ratio so as to crystallize the amorphous layer to form a plurality of first crystallized regions B1, which is shown in FIG. 8B. Afterward, as defined by the solid line in FIG. 8A, the mask is moved along the direction of the lengthwise edges of the transparent region. Then, the second laser illumination step is executed to form a plurality of second crystallized regions B2 in the amorphous layer as shown in FIG. 8C.

It should be noted that the second crystallized regions B2 generated in the second laser illumination step and the first crystallized regions B1 must have sufficient overlap to make sure the random portion near the rear edge of the first crystallized region B1 is repaired. Thus, it is predictable that in order to form a qualified polycrystalline layer, the distance D1 between the first crystallized region B1 and the respected second crystallized region B2 must be smaller than the length S1 of the lengthwise edges of the first crystallized region B1. That is, the distance D1 must be smaller than the length X1 of the lengthwise edges of the transparent region of FIG. 8A multiplied by the projecting ratio with which the transparent region projecting on the amorphous layer.

In FIG. 8A, the mask moves rightward for the following laser illumination steps to repair the random portion near the rear edge of the first crystallized regions. However, the direction of the movement of the mask should not be a limitation in the present invention. The only limitation in accordance with the present invention is that the distance D1 between the first crystallized region B1 and the respected second crystallized region B2 must be smaller than the length of the lengthwise edges of the crystallized regions B1, B2.

As shown in the traditional SLS process of FIG. 6C, the distance between the first crystallized region A1 and the third crystallized region A3 must be smaller than the length of the central portion b with lateral grains for achieving ideal crystallization event. Whereas, as shown in the SLS process in accordance the present invention of FIG. 8B, the distance D1 between the first crystallized region B1 and the respected second crystallized region B2 formed in the two sequential laser illumination steps has no limitation like that.

In detail, assuming the transparent region in accordance with the present invention and the traditional transparent region of FIG. 4A are of the same length, having the front edges of the same shape, and having the rear edges of the same shape but pointing toward opposite directions. It is understood that the length L of the lengthwise edges of the first crystallized region A1 is identical to the length S1 of the lengthwise edges of the first crystallized region B1 minus the distance r between the top of the V-shaped rear edge and a respected edge of the quadrilateral defined by the lengthwise edges of the first crystallized region B1.

In conclusion, as shown in FIG. 8A, the allowable distance D1 between the first crystallized region B1 and the second crystallized region B2 may be greater than the allowable distance by using the traditional mask. The only limitation is that the distance D1 should not be greater than the length of the lengthwise edges of the first crystallized region B1 minus the distance r of the rear edge. Therefore, it is understood that the allowable distance with which the mask moves between two sequential laser illumination steps in the SLS process of the present invention is greater than that of the traditional SLS process, and a higher fabrication speed may be achieved. In addition, the enhancement of the fabrication speed attends with an advantage that the overlap between the crystallized regions of the two sequential laser illumination steps may be reduced to prevent too much energy being absorbed to increase the probability of holing within crystallized layer due to agglomeration.

While the embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

I claim:

1. A mask for an SLS process to crystallize amorphous layer into a polycrystalline layer, comprising:
    a transparent region defined by two lengthwise edges, a front edge, and a rear edge, wherein the two lengthwise edges and the rear edge defining a quadrilateral, the front edge being located outside the quadrilateral and the front edge comprises V-shaped, circular-shaped, or trapezoid-shaped.

2. The mask of claim 1 wherein the two lengthwise edges have identical length.

3. The mask of claim 2 wherein the front edge comprises V-shaped, and both sides of the V-shaped front edge are of identical length.

4. The mask of claim 3 wherein the front edge comprises V-shaped, and the angle of the V-shaped front edge is between about 10 degrees to about 90 degrees.

5. A method of using a mask for an SLS process to crystallize amorphous layer into a polycrystalline layer, the masking comprising a transparent region defined by two lengthwise edges, a front edge, and a rear edge, wherein the two lengthwise edges and the rear edge defining a quadrilateral, the front edge being located outside the quadrilateral and the front edge comprises V-shaped, circular-shaped, or trapezoid-shaped, the method comprising:
    providing a substrate;
    forming an amorphous layer on the substrate;
    having the mask aligned to the substrate;
    crystallizing the amorphous layer through the mask to form a plurality of first crystallized regions therein respecting to the transparent regions;
    moving the mask to have the front edge or the rear edge of the transparent region projecting on the amorphous layer overlapping the first crystallized regions; and
    crystallizing the amorphous layer through the mask to form a plurality of second crystallized regions.

6. The method of claim 5 wherein the mask moves along the lengthwise edges of the transparent region.

7. The method of claim 6 wherein the mask moves with a distance smaller than a length of the lengthwise edge.

8. The method of claim 7 wherein the mask moves with the distance greater than the length of the lengthwise edge minus a distance between the top of the V-shaped rear edge and a respected edge of the quadrilateral.

* * * * *